United States Patent
Wu et al.

(10) Patent No.: US 9,177,750 B2
(45) Date of Patent: Nov. 3, 2015

(54) ION SOURCE DEVICE AND METHOD FOR PROVIDING ION SOURCE

(71) Applicant: Semiconductor Manufacturing International (Shanghai) Corporation, Shanghai (CN)

(72) Inventors: Lulei Wu, Shanghai (CN); Leon Shan, Shanghai (CN); Chunrong Dong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/094,815

(22) Filed: Dec. 3, 2013

(65) Prior Publication Data
US 2014/0110598 A1    Apr. 24, 2014

(51) Int. Cl.
*H01J 27/08* (2006.01)
*H01J 37/08* (2006.01)

(52) U.S. Cl.
CPC ............... *H01J 27/08* (2013.01); *H01J 37/08* (2013.01); *H01J 2237/006* (2013.01); *H01J 2237/082* (2013.01)

(58) Field of Classification Search
USPC .................................................. 250/424, 426
See application file for complete search history.

(56) References Cited

U.S. PATENT DOCUMENTS

| | | | | |
|---|---|---|---|---|
| 3,924,134 | A * | 12/1975 | Uman et al. | 250/423 R |
| 6,633,133 | B1 * | 10/2003 | Ishida | 315/111.81 |
| 7,397,048 | B2 * | 7/2008 | Singh et al. | 250/492.21 |
| 2006/0060797 | A1 | 3/2006 | Kwon et al. | |
| 2008/0179545 | A1 * | 7/2008 | Perel et al. | 250/492.21 |
| 2010/0155619 | A1 * | 6/2010 | Koo et al. | 250/424 |

* cited by examiner

*Primary Examiner* — Robert Kim
*Assistant Examiner* — Eliza Osenbaugh-Stewar
(74) *Attorney, Agent, or Firm* — Anova Law Group, PLLC

(57) ABSTRACT

Various embodiments provide an ion source device and a method for providing the ion source. An exemplary ion source device can include an arc chamber, a filament, a reflector, a slit outlet, a source gas inlet, and/or a cleaning gas inlet. The filament can be configured to generate thermo-electrons in the arc chamber. The reflector can be configured to reflect the thermo-electrons back to the arc chamber. The slit outlet can be configured to exit a gaseous material out of the arc chamber. The source gas inlet and the cleaning gas inlet can be located on a same sidewall of the arc chamber configured to respectively introduce an ion source gas and an inert cleaning gas into the arc chamber.

9 Claims, 3 Drawing Sheets

ION SOURCE DEVICE AND METHOD FOR PROVIDING ION SOURCE

CROSS-REFERENCES TO RELATED APPLICATIONS

This application claims priority to Chinese Patent Application No. CN201210559934.X, filed on Dec. 20, 2012, the entire contents of which are incorporated herein by reference.

FIELD OF THE DISCLOSURE

The present disclosure relates to the field of semiconductor technology and, more particularly, relates to an ion source device of an ion implanter and a method of providing an ion source for an ion implantation.

BACKGROUND

Ion implantation is a technique in semiconductor technology that is used for selectively implanting an impurity material into a semiconductor material. In ion implantation process, the impurity material is ionized in an ionization chamber. The ions are accelerated to form an ion beam with a preset energy. The ion beam bombards the surface of a wafer and enters the wafer to reach a depth associated with the energy.

An ion implanter usually transforms a gas-state or solid-state impurity material into a plasma in an arc chamber. The plasma is then guided out of the arc chamber to form an ion beam. The ion beam may undergo quality analysis to eliminate unwanted ion species and may be accelerated to have a preset energy and then be introduced to the surface of a wafer.

FIG. 1 depicts a cross-sectional view of an ion source of an existing ion implanter. The ion source includes: an arc chamber 100; a reflector 102, a filament 103, and a source gas inlet 104. The filament 103 is located on the sidewall of the arc chamber 100. When connected to a power supply, the filament 103 heats up to generate thermo-electrons. The reflector 102 is located on sidewall opposite to the filament 103. The reflector 102, when connected to a power supply, is used to reflect the thermo-electrons generated by the filament 103 in order to prevent the thermo-electrons from being lost through the body of the arc chamber 100. The source gas inlet 104 is located at the bottom of the arc chamber 100, for passing an ion source gas into the arc chamber 100. The ion source gas is ionized into a plasma by colliding with the thermo-electrons generated by the filament 103. The plasma is then guided out of the arc chamber 100 through an outlet slit 101 at the top of the arc chamber 100.

When the ion source generates the plasma, associated by-products or impurity particles are formed in the arc chamber 100 and adhered to the inner surface of the arc chamber 100. A layer of conductive film is formed on the inner surface of the arc chamber 100. The layer of conductive film may also be formed on the filament 103 and the reflector 102. The conductive film tends to cause short-circuit of the filament 103. In addition, the conductive film can be easily fallen off from the inner surface of the arc chamber 100. When the conductive film falls on or near the filament 103, the stability of the filament 103 is affected. The service life of the implanter is significantly reduced.

BRIEF SUMMARY OF THE DISCLOSURE

One aspect of present disclosure includes an ion source device of an ion implanter. The device can include an arc chamber, a filament, a reflector, a slit outlet, a source gas inlet, and a cleaning gas inlet. The filament can be located on a first sidewall of the arc chamber and configured to generate thermo-electrons to ionize a gas into a plasma in the arc chamber. The reflector can be located on a second sidewall of the arc chamber opposite to the first sidewall and configured to reflect the thermo-electrons back to the arc chamber. The slit outlet can be located on a top of the arc chamber and configured to exit a gaseous material out of the arc chamber. The source gas inlet can be located on a third sidewall of the arc chamber and configured to introduce an ion source gas into the arc chamber. The third sidewall is between the first sidewall and the second sidewall. The cleaning gas inlet can be located on the third sidewall of the arc chamber and configured to introduce an inert cleaning gas into the arc chamber.

Another aspect of present disclosure includes a method for providing an ion source for an ion implantation. A filament can be connected to a power supply to generate thermo-electrons in an arc chamber. An inert cleaning gas can be introduced into the arc chamber through a cleaning gas inlet such that the thermo-electrons ionize at least a portion of the inert cleaning gas into a first plasma, wherein the first plasma, a remaining portion of the inert cleaning gas, or a combination thereof form a separation layer near an inner surface of the arc chamber. An ion source gas can be introduced into the arc chamber through a source gas inlet, such that the thermo-electrons ionize the ion source gas into a second plasma and the second plasma is separated from the inner surface of the arc chamber by the separation layer. The second plasma can be extracted out of the arc chamber to provide an ion beam.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. For illustration purposes, the schematic drawings may be not to scale. The schematic drawings are solely illustrative, and should not limit the scope of the present disclosure. In addition, three-dimensional scales of length, width and depth should be included in practical fabrication process.

When an ion source gas enters an arc chamber and is ionized to form a plasma, by-products (e.g., including impurity particles) may be generated to form a layer of conductive film on the sidewall(s) of the arc chamber. The conductive film can result in short-circuit of a filament, affecting service life of the ion source device.

Various embodiments provide an ion source device of an implanter. There can be a cleaning gas inlet on the sidewall of the arc chamber of the ion source. An inert cleaning gas can be passed into the arc chamber through the cleaning gas inlet. The inert cleaning gas can have high stability. Even if a portion or all of the inert cleaning gas is ionized into a first plasma, the first plasma can be chemically inactive. Thus, the inert cleaning gas and the first plasma formed by ionization can occupy a portion of the space in the arc chamber, and can separate the inner surface of the arc chamber from a second plasma formed by ionization of an ion source gas. This can thereby prevent or reduce formation of a conductive film on the inner surface of the arc chamber by the by-products or impurity particles formed by the ionization of the ion source gas. In addition, the inert cleaning gas and the first plasma formed by ionization can carry the fallen conductive film out of the arc chamber through a slit outlet. Thus the service life of the device for providing ion source in an implanter can be increased.

Figure 1:
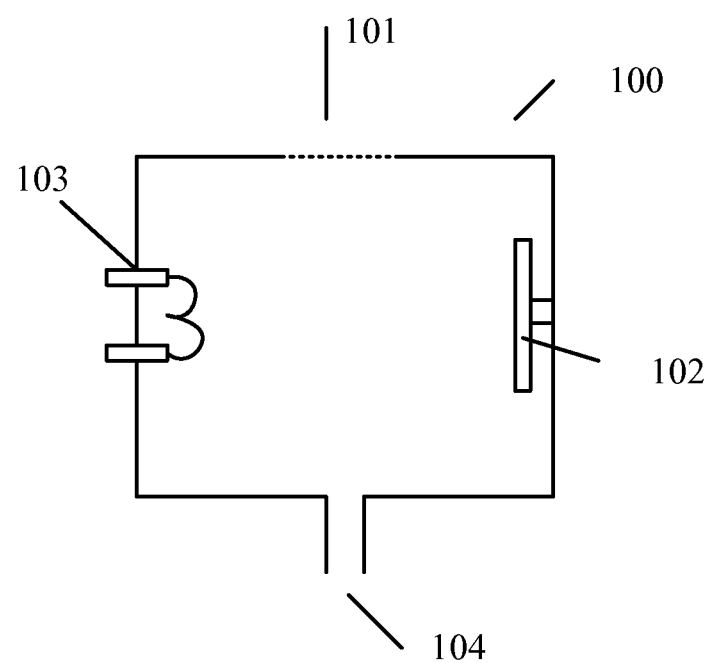
FIG. 1 depicts a cross-sectional view of a conventional ion source device.
Figure 2:
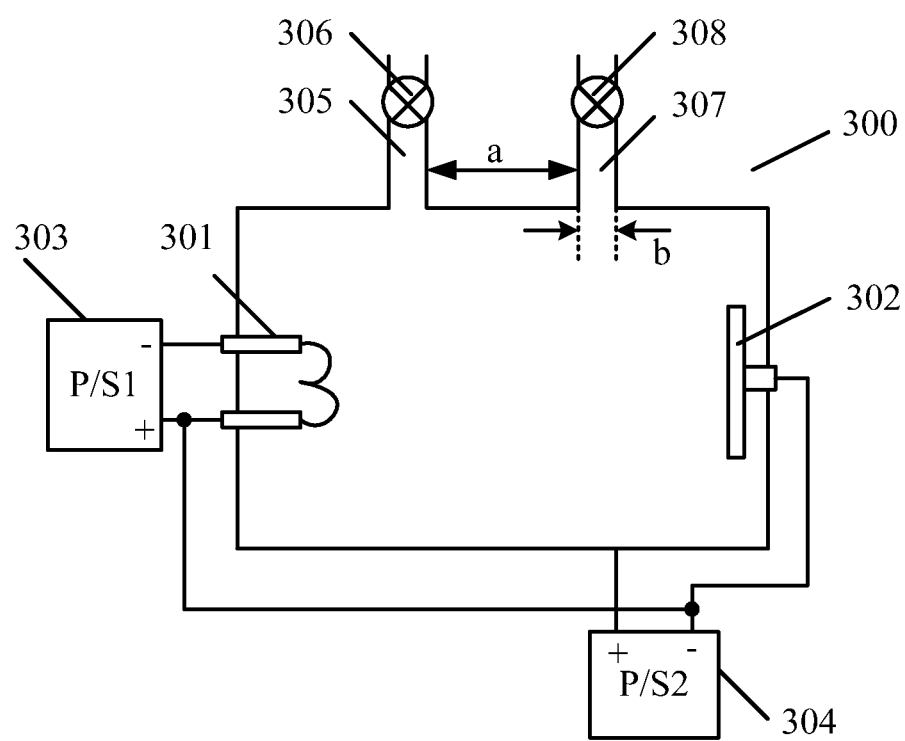
FIG. 2 depicts top view of an exemplary ion source device of an ion implanter in accordance with various disclosed embodiments.
Figure 3:
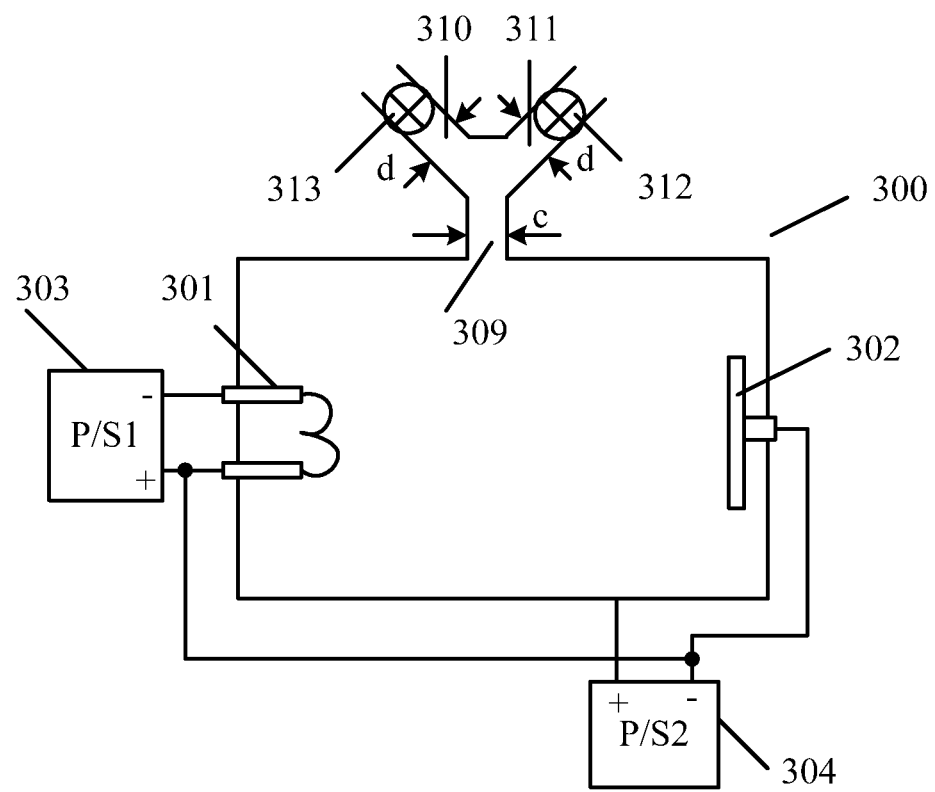
FIG. 3 depicts top view of another exemplary ion source device of an ion implanter in accordance with various disclosed embodiments.

FIGS. 2-3 depict top views of exemplary ion source devices in accordance with various disclosed embodiments.

In FIG. 2, the exemplary ion source device can include: an arc chamber 300, a filament 301, a reflector 302, a source gas inlet 305, a cleaning gas inlet 307, and/or a slit outlet (not shown).

The arc chamber 300 can accommodate plasmas. The filament 301 can be located on the sidewall of the arc chamber 300, for generating thermo-electrons. For example, an ion source gas can be ionized into plasma upon entering the arc chamber 300 containing generated thermo-electrons. Both ends of the filament 301 can be respectively connected to electrodes. The electrodes can be fixed to the sidewall of the arc chamber 300. An insulating layer can be configured between the filament 301 and the underlying sidewall.

The reflector 302 can be located on the sidewall of the arc chamber 300 that is opposite to the filament 301 for reflecting the thermo-electrons generated by the filament 301. The slit outlet (not shown) can be located on the top of the arc chamber 300 to exit the plasma or other gases out of the arc chamber 300.

The source gas inlet 305 can be located on the sidewall of the arc chamber 300 between the reflector 302 and the filament 301, for introducing the ion source gas. The cleaning gas inlet 307 and the source gas inlet 305 can be located on a same sidewall of the arc chamber 300, for introducing an inert cleaning gas.

The filament 301 can be connected to a first voltage supply unit 303. The first voltage supply unit 303 can apply a voltage to the filament 301, such that sufficient current can flow in the filament 301 to generate thermo-electrons having a high temperature of several thousand degrees. The thermo-electrons can be emitted from the filament 301.

The ion source device can also include a second voltage supply unit 304. The positive electrode of the second voltage supply unit 304 can be connected to the sidewall of the arc chamber 300, for providing an accelerating electric field. The thermo-electrons emitted by the filament 301 can thus have enough energy to collide with the ion source gas that enters the arc chamber 300 and to ionize the ion source gas into plasma. In order for the thermo-electrons to obtain enough energy, the positive voltage applied by the positive electrode of the second voltage supply unit 304 can range from about 50 volts to about 200 volts, or greater than about 200 volts.

The negative electrode of the second voltage supply unit 304 can be connected to the reflector 302. The voltage applied by the negative electrode can range from about −5 volts to about −10 volts. Thus, the thermo-electrons emitted by the filament 301 can be reflected back to the arc chamber 300. Thermo-electrons can be prevented from flowing out through the body of the arc chamber 300.

The cleaning gas inlet 307 can be used for passing the inert cleaning gas. The inert cleaning gas can be ionized into, e.g., a first plasma. The first plasma can have high stability and can be chemically inactive in a high temperature environment. Thus, the first plasma can chemically react neither with a second plasma formed from the ionized ion source gas, nor with the associated by-products or impurity particles of the second plasma. The first plasma can occupy a portion of the space in the arc chamber 300, and can form a separation layer of the first plasma to separate the inner surface of the arc chamber 300 from the second plasma and its associated by-products or impurity particles in the arc chamber 300. Thus, the formation of a conductive film containing the second plasma and/or associated by-products (e.g., including impurity particles) on the inner surface of the arc chamber 300 can be effectively prevented, or the amount of the conductive film formed on the inner surface of the arc chamber 300 can be effectively reduced. In addition, the gas flow generated by the first plasma can carry the fallen portion of the conductive film out of the arc chamber 300. Thus the service life of the ion source device can be increased.

The inert cleaning gas can include, e.g., argon and/or helium. In one embodiment, the inert cleaning gas can be argon. Argon can be stable at high temperatures, and can be chemical inactive. In addition, the cost of argon gas can be low. Argon can also be used as a test gas for detecting gas leakage of the arc chamber 300.

Further, the straight-line distance between the cleaning gas inlet 307 and the filament 301 can be greater than the straight-line distance between the source gas inlet 305 and the filament 301. When the ion source gas enters through the source gas inlet 305, the ion source gas can be close to the filament 301, and far from the reflector 302. Thus, a portion of the inert cleaning gas that enters the arc chamber 300 via the cleaning gas inlet 307 is not ionized. The remaining inert gas in the arc chamber 300 can be unaffected by the electric field in the arc chamber 300. The remaining inert gas and the first plasma formed by ionization can be uniformly distributed on or near the inner surface of the arc chamber 300. In addition, the gas flow generated by the remaining inert gas and by the first plasma can carry a portion of the fallen conductive film or any other impurities out of the arc chamber 300. Formation of the conductive film on the inner surface of the arc chamber 300 can be effectively prevented, or the amount of the conductive film formed on the inner surface of the arc chamber 300 can be effectively reduced.

The straight-line distance a spaced between adjacent sidewalls of the cleaning gas inlet 307 and the source gas inlet 305 can range from about 40 mm to about 60 mm or any other suitable distance, such that gases flow from the inlets 305, 307 do not influence each other. A suitable distance between the cleaning gas inlet 307 and the filament 301 should be maintained. The diameter b of the cleaning gas inlet 307 can range from about 5 mm to about 15 mm or any other suitable distance. Thus the gas flow rate passed through the cleaning gas inlet 307 can be precisely controlled with minor or minimized influence on the uniformity of vacuum distribution in the arc chamber 300.

A control valve 308 can be provided at the cleaning gas inlet 307, for switching and controlling the inert cleaning gas passing through the cleaning gas inlet 307. The opening and closing of the control valve 308 can be controlled by electrical signals.

A control valve 306 can be provided at the source gas inlet 305, for switching and controlling the ion source gas passing through the source gas inlet 305. The opening and closing of the control valve 306 can be controlled by electrical signals.

In some embodiments, the material of making the cleaning gas inlet 307 can be the same as the bulk material of the arc chamber 300. The number of the cleaning gas inlet 307 can be one, although any number of the cleaning gas inlets can be encompassed in accordance with various disclosed embodiments. For example, the number of cleaning gas inlets can be two, three, four, etc.

When there are more than one cleaning gas inlets, at the same flow rate, there can be a greater amount of the inert cleaning gas. Accordingly, the separation layer formed by the inert cleaning gas and its first plasma can be thicker. Less conductive film can be formed on the inner surface of the arc chamber. In the case when the number of cleaning gas inlets is greater than one, the cleaning gas inlets can be configured on a same sidewall where the source gas inlet is located. The plurality of cleaning gas inlets can be configured along a straight line that is perpendicular to the bottom of the arc chamber. Alternatively, the plurality of cleaning gas inlets may be located on one or multiple sidewalls of the arc chamber, in order to improve the uniformity of the separation layer formed by the inert cleaning gas and the first plasma.

An electric field induction unit (not shown) can be provided at the exterior of the arc chamber 300. The electric field induction unit can generate electromagnetic fields of varied intensities in the arc chamber 300, in order to influence the intensity of collisions between the thermo-electrons generated by the filament 301 and the ion source gas.

The arc chamber 300 can also include a draw-out electrode system (not shown) located near the slit outlet, for draw-out of a gaseous material (e.g., plasma) through the slit outlet to form an ion beam for ion implantation.

In another embodiment, referring to FIG. 3, a source gas inlet 310 and a cleaning gas inlet 311 can be connected to the sidewall of the arc chamber 300 through a third inlet 309. The source gas inlet 310, the cleaning gas inlet 311, and the third inlet 309 can form a three-way pipe.

The source gas inlet 310 and the cleaning gas inlet 311 can be connected to the sidewall of the arc chamber 300 through the third inlet 309. The source gas inlet 310 and the cleaning gas inlet 311 can occupy only a small space on the sidewall of the arc chamber 300. When the source gas inlet 310 and/or the cleaning gas inlet 311 are opened or closed, the influence on the vacuum in the arc chamber 300 can be minor. The outer sidewall of the source gas inlet 310 and the outer sidewall of the cleaning gas inlet 311 can form an angle with the outer sidewall of the third inlet 309. The angle can range from about 100 degrees to about 150 degrees or any other suitable degree. The ion source gas entering through the source gas inlet 310 and the inert cleaning gas entering through the cleaning gas inlet 311 can have low opposed forces between each other, and can be substantially or fully mixed at the third inlet 309.

A control valve 312 can be provided at the cleaning gas inlet 311, for switching and controlling the inert cleaning gas passing through the cleaning gas inlet 311. The opening and closing of the control valve 312 can be controlled by electrical signals. A control valve 313 can be provided at the source gas inlet 310, for switching and controlling the ion source gas passing through the source gas inlet 310. The opening and closing of the switch control valve 313 can be controlled by electrical signals.

The diameter d of the cleaning gas inlet 311 can be equal to the diameter d of the source gas inlet 310, and can range from about 10 mm to about 12 mm. The diameter c of the third inlet 309 can range from about 5 mm to about 10 mm. The length of the third inlet 309 can range from about 10 mm to about 30 mm or from about 15 mm to about 25 mm, e.g., about 20 mm.

There is also provided a method of ion implantation using the ion source device in accordance with various disclosed embodiments. Referring to FIG. 2, the first voltage supply unit 303 supplies voltages to the two ends of the filament 301. After the two ends of the filament 301 are connected to the power supply, the filament 301 can be heated to a high temperature of several thousand degrees, and can generate thermo-electrons. In various embodiments, the supply of voltages to the two ends of the filament 301 can also be performed after introducing the inert cleaning gas and/or the ion source gas.

An inert cleaning gas is passed into the arc chamber 300 through the cleaning gas inlet 307. The thermo-electrons can ionize all or a portion of the inert cleaning gas into a first plasma. The inert cleaning gas can be, e.g., argon. Because the cleaning gas inlet 307 can be relatively far away from the filament 301, a portion of the inert cleaning gas can exist in a gas state. In some embodiments, the inert cleaning gas can be introduced into the arc chamber 300 before introduction of an ion source gas into the arc chamber 300. Thus, before the ion source gas enters for ionization, a portion of the inert cleaning gas and the first plasma can occupy a portion of the space in the arc chamber 300, and can form in advance a separation layer including the inert cleaning gas and the first plasma ionized from a portion of the inert cleaning gas. When the ion source gas is subsequently ionized to form the second plasma and the associated by-products (including impurity particles), the second plasma and the associated by-products can be effectively prevented from forming a conductive film on the inner surface of the arc chamber 300. In other embodiments, when the inert cleaning gas is introduced into the arc chamber 300, the ion source gas can be introduced into the arc chamber 300 at the same time.

The ion source gas can be introduced into the arc chamber 300 through the source gas inlet 305. The thermo-electrons can ionize the ion source gas into the second plasma. The ion source gas can include $BF_3$, $PH_3$ and/or $AsH_3$. The ion source gas can also be a gas containing doping elements.

In some embodiments, the flow rate of the inert cleaning gas passed through the cleaning gas inlet 307 can be greater than the flow rate of the ion source gas passed through the source gas inlet 305. The flow rate of the inert cleaning gas passed through the cleaning gas inlet 307 can range from about 0.5 sccm to about 3 sccm. The flow rate of the ion source gas passed through the source gas inlet 305 can range from about 0.5 sccm to about 1 sccm. Thus, the amount of the inert cleaning gas and the first plasma can be relatively great. Separation effect of the inert cleaning gas and the first plasma can be achieved. The flow of the inert cleaning gas and the generated first plasma can carry away fallen conductive film. In addition, the cleaning gas inlet 307 can be relatively far away from the filament 301, and the flow rate of the inert cleaning gas being introduced can be sufficiently low to provide minor effect on the ionization of the ion source gas.

In other embodiments, the flow rate of the inert cleaning gas passed through the cleaning gas inlet 307 can be equal to the flow rate of the ion source gas passed through the source gas inlet 305 into the arc chamber 300.

The second plasma is extracted from the arc chamber 300 through the slit outlet to form an ion beam for ion implantation. For example, the ion beam can be filtered through an electromagnetic coil and pass through a suitable lens unit, and then be implanted into a wafer ready for implantation.

After the ion implantation is completed, the ion source gas is shut off from being passed into the arc chamber. The inert cleaning gas, however, can be maintained in the arc chamber. Therefore, the by-products of ionization of the ion source gas remaining in the arc chamber can be extracted via the slit outlet with the inert cleaning gas. The by-products of ionization remaining in the arc chamber can be prevented from forming the conductive film on the inner surface of the arc chamber 300.

In this manner, an ion source device of an ion implanter is provided. There can be a cleaning gas inlet on the sidewall of an arc chamber of the ion source device. An inert cleaning gas can be passed into the arc chamber through the cleaning gas inlet. The inert cleaning gas can have high stability. Even if a portion or all of the inert cleaning gas is ionized into a first plasma, the first plasma can be chemically inactive in a high temperature environment. Thus, the inert cleaning gas and the first plasma formed by ionization can occupy a portion of the space in the arc chamber, and can separate the inner surface of the arc chamber from a second plasma formed by the ionization of an ion source gas. This reduces or eliminates formation of a conductive film on the inner surface of the arc chamber by the by-products (including impurity particles) formed by the ionization of the ion source gas. In addition, the inert cleaning gas and the first plasma formed by ionization can carry the fallen conductive film out of the arc chamber through a slit outlet. Thus the service life of the ion source device can be increased.

Further, the straight-line distance between the cleaning gas inlet and the filament can be greater than the straight-line distance between the source gas inlet and the filament. When an ion source gas enters through the source gas inlet, the ion source gas can be close to the filament, and far from the reflector. Thus, a portion of the inert cleaning gas that enters the arc chamber will not be ionized. The remaining inert gas in the arc chamber can be unaffected by the electric field in the arc chamber. The remaining inert cleaning gas and the first plasma formed by ionization of a portion of the inert cleaning gas can be uniformly distributed near the inner surface of the arc chamber. In addition, the gas flow generated by the remaining inert gas and by the first plasma can carry a portion of the fallen conductive film out of the arc chamber. Thus, the formation of the conductive film on the inner surface of the arc chamber can be effectively prevented, or the amount of the conductive film formed on the inner surface of the arc chamber can be effectively reduced.

Further, the number of cleaning gas inlets can one, two, three, four, etc. When there are more than one cleaning gas inlets, at a fixed flow rate, there can be a greater amount of the inert cleaning gas being passed into the arc chamber. Thus, the separation layer formed by the inert cleaning gas and the first plasma can be thicker. Formation of the conductive film by the second plasma and its by-products on the inner surface of the arc chamber can be further prevented.

According to various disclosed embodiments, there is provided a method of ion implantation. An inert cleaning gas can be passed into an arc chamber through a cleaning gas inlet. At least a portion of the inert cleaning gas can be ionized into a first plasma. The first plasma can have high stability and can be chemically inactive in a high temperature environment. The first plasma can chemically react neither with a second plasma formed from an ionized ion source gas, nor with associated by-products (e.g., impurity particles). The first plasma (and/or remaining unionized inert cleaning gas) can occupy a portion of the space in the arc chamber, and can form a separation layer of the first plasma that can separate the inner surface of the arc chamber from the second plasma in the arc chamber and the associated by-products. Thus, the formation of a conductive film on the inner surface of the arc chamber can be effectively prevented, or the amount of the conductive film formed on the inner surface of the arc chamber can be effectively reduced. In addition, the gas flow generated by the first plasma can carry fallen portions of the conductive film out of the arc chamber. Thus the service life of the ion source device can be increased.

Further, the inert cleaning gas can be passed into the arc chamber before the ion source gas is passed into the arc chamber. Therefore, before the ion source gas is ionized, a portion of the inert cleaning gas and the first plasma can occupy a portion of the space in the arc chamber, and can form in advance near the inner surface of the arc chamber, a separation layer that includes the inert cleaning gas and the first plasma. When the ion source gas is subsequently ionized to form the second plasma and associated by-products, the formation of the conductive film on the inner surface of the arc chamber by the second plasma and the associated by-products can be effectively prevented.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of providing an ion source for an ion implantation, comprising:
   connecting a filament to a power supply to generate thermo-electrons in an arc chamber;
   introducing an inert cleaning gas into the arc chamber through a cleaning gas inlet configured in a sidewall different from a sidewall configured with the filament, such that the thermo-electrons ionize at least a portion of the inert cleaning gas into a first plasma, wherein the first plasma, a remaining portion of the inert cleaning gas, or a combination thereof form a separation layer near an inner surface of the arc chamber;
   introducing an ion source gas into the arc chamber through a source gas inlet, such that the thermo-electrons ionize the ion source gas into a second plasma and the second plasma is separated from the inner surface of the arc chamber by the separation layer; and
   extracting the second plasma out of the arc chamber to provide an ion beam.

2. The method of claim 1, wherein the inert cleaning gas includes argon, helium, or a combination thereof.

3. The method of claim 1, wherein a flow rate of the inert cleaning gas introduced through the cleaning gas inlet is greater than or equal to a flow rate of the ion source gas introduced through the source gas inlet.

4. The method of claim 3, wherein the flow rate of the inert cleaning gas introduced through the cleaning gas inlet ranges from about 0.5 sccm to about 3 sccm.

5. The method of claim 3, wherein the flow rate of the ion source gas introduced through the source gas inlet ranges from about 0.5 sccm to about 1 sccm.

6. The method of claim 1, wherein the inert cleaning gas is introduced into the arc chamber through the cleaning gas inlet, before the ion source gas is introduced into the arc chamber through the source gas inlet.

7. The method of claim 1, wherein the inert cleaning gas and the ion source gas are simultaneously introduced into the arc chamber.

8. The method of claim 1, further including:
shutting off the ion source gas from being introduced into the arc chamber;
maintaining introduction of the inert cleaning gas into the arc chamber; and
extracting by-products from ionization of the ion source gas with the inert cleaning gas from the arc chamber through a slit outlet.

9. The method of claim 1, wherein a portion of the inert cleaning gas that enters the arc chamber via the cleaning gas inlet is not ionized.

* * * * *